(12) United States Patent
Stroet

(10) Patent No.: US 6,972,624 B1
(45) Date of Patent: Dec. 6, 2005

(54) LOW-VOLTAGE HIGH DYNAMIC RANGE VARIABLE-GAIN AMPLIFIER

(75) Inventor: Petrus Martinus Stroet, Santa Cruz, CA (US)

(73) Assignee: Linear Technology Corporation, Milpitas, CA (US)

( * ) Notice: Subject to any disclaimer, the term of this patent is extended or adjusted under 35 U.S.C. 154(b) by 72 days.

(21) Appl. No.: 10/637,747

(22) Filed: Aug. 8, 2003

(51) Int. Cl.[7] ................................................. H03F 3/45
(52) U.S. Cl. ..................................... 330/254; 330/283
(58) Field of Search ............................... 330/254, 256, 330/260, 283, 292; 327/359

(56) References Cited

U.S. PATENT DOCUMENTS

| | | | |
|---|---|---|---|
| 3,908,172 A * | 9/1975 | Aschermann et al. ....... | 330/254 |
| 5,389,832 A * | 2/1995 | Boerstler et al. ........... | 327/223 |
| 5,471,173 A | 11/1995 | Moore et al. | |
| 5,790,943 A | 8/1998 | Fotowat-Ahmady et al. | |
| 6,442,380 B1 | 8/2002 | Mohindra | |
| 6,721,548 B1 | 4/2004 | Mohindra et al. | |
| 6,727,755 B2 * | 4/2004 | Islam et al. ................. | 330/254 |
| 6,804,499 B2 | 10/2004 | Khosrowbeygi et al. | |
| 2002/0146991 A1 | 10/2002 | Khosrowbeygi et al. | |
| 2002/0146992 A1 | 10/2002 | Khosrowbeygi | |
| 2004/0161030 A1 | 8/2004 | Mohindra et al. | |

OTHER PUBLICATIONS

Sansen et al., "An Integrated Wide-Band Variable-Gain Amplifier with Maximum Dynamic Range", IEEE Journal of Solid-State Circuits, vol. SC-9, No. 4, Aug. 1974.
Meyer et al., "A DC to 1-GHz Differential Monolithic Variable-Gain Amplifier", IEEE Journal of Solid-State Circuits, vol. 26, No. 11, Nov. 1991.
Otaka et al., "A Low-Power Low-Noise Accurate Linear-in-dB Variable-Gain Amplifier with 500-MHz Bandwidth", IEEE Journal of Solid-State Circuits, vol. 35, No. 12, Dec. 2000.
Stroet et al., "A Zero-IF Single-Chip Transceiver for up to 22Mb/s OPSK 802.11b Wireless LAN", 2001 IEEE International Solid-State Circuits Conference.

* cited by examiner

*Primary Examiner*—Steven J. Mottola
(74) *Attorney, Agent, or Firm*—Townsend and Townsend and Crew LLP

(57) ABSTRACT

Circuits and methods for providing a variable gain while powered from a low-voltage supply. In a specific embodiment, an input signal is converted to a current by an emitter-degenerated pair. A portion of the input current is discarded, while the remainder is variably steered between a shunt stage or an AC ground such as VCC. The output of the shunt stage is buffered by a high speed output, the bandwidth of which is increased by feed-forward capacitors. This arrangement may be optionally repeated for additional gain.

26 Claims, 6 Drawing Sheets

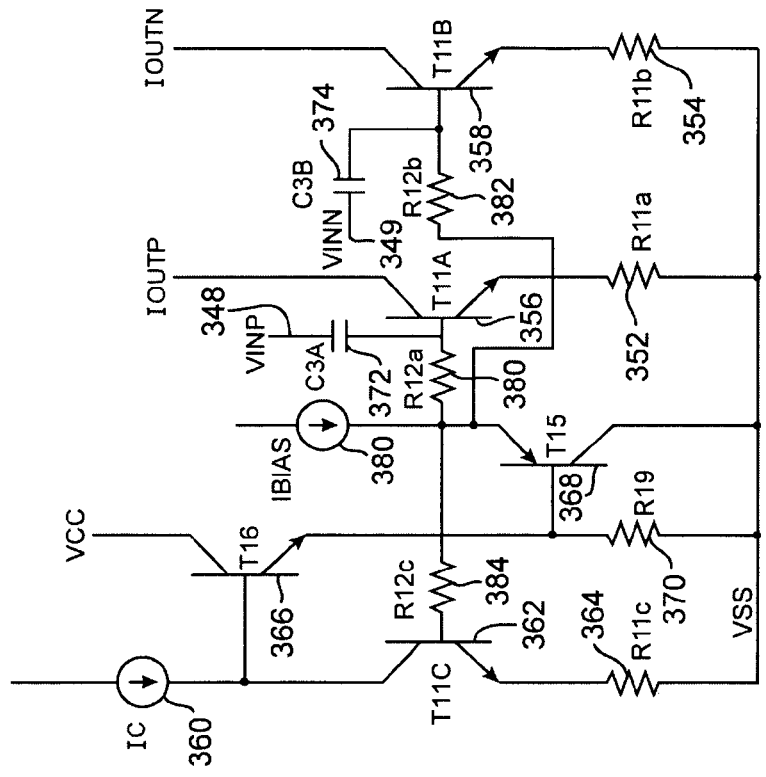
FIG. 3B
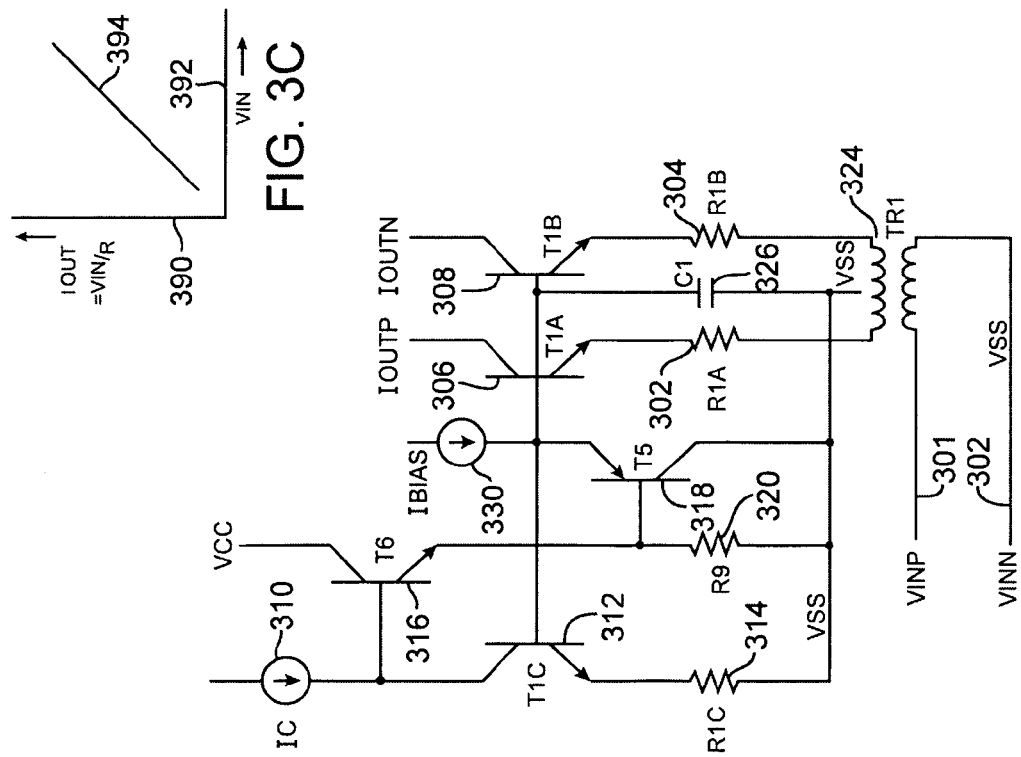
FIG. 3C
FIG. 3A

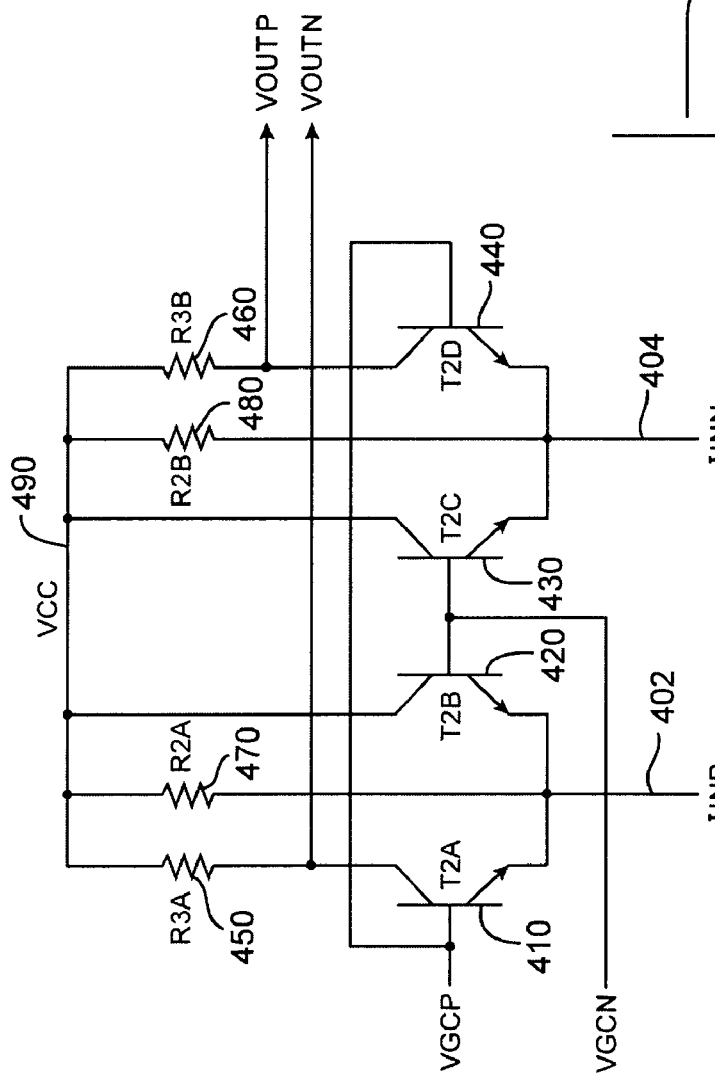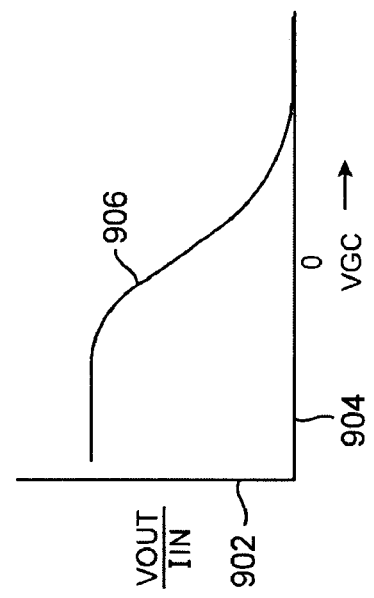
FIG. 4A
FIG. 4B

LOW-VOLTAGE HIGH DYNAMIC RANGE VARIABLE-GAIN AMPLIFIER

CROSS-REFERENCES TO RELATED APPLICATIONS

This application is related to U.S. patent application Ser. No. 10/637,714, titled A LOW VOLTAGE PRE-DISTORTION CIRCUIT FOR LINEAR-IN-dB VARIABLE-GAIN CELLS, by Stroet, which is incorporated by reference.

BACKGROUND

The present invention relates to amplifiers for integrated circuits, particularly to variable-gain amplifiers.

Variable-gain amplifiers are useful in applications such as radio frequency receivers where a fixed output voltage level is desirable, but the signal strength of an input signal varies. If a received signal is weak, a variable-gain amplifier should gain the signal to the desired output level without adding an unacceptable amount of noise. If the received signal is strong, the variable-gain amplifier should remain linear such that clipping of the signal and the introduction of harmonics does not occur. This performance at low and high received signal levels requires a variable-gain amplifier to have a large dynamic range.

This is complicated by the desire to achieve this performance at low operating voltages. The trend towards lower voltages has been driven by a desire for lower power supply dissipation, longer battery life in mobile devices, as well as the use of smaller geometry integrated circuit devices, which require the use of lower supply voltages. Voltage supplies, while plus and minus 15 volts many years ago, shrunk to 5 volts, then 3.3 volts, and are now at 1.8 volts. These voltages are certain to be reduced again in the future. Designing high performance circuits that can operate at these lower voltages requires innovation, particularly in circuits made using a bipolar process, since transistor base-to-emitter voltages have not correspondingly reduced, but have remained essentially constant.

Thus, what is needed is a variable-gain amplifier having a large dynamic range that is capable of operating at these lower voltages.

SUMMARY

Accordingly, embodiments of the present invention provide circuits and methods for providing a variable gain to an input signal while powered from a low-voltage supply. In a specific embodiment, an input voltage signal is converted to a current. A portion of this current is discarded, while the remainder is variably steered between a shunt stage or an AC ground such as a supply voltage. The output of the shunt stage is buffered by a high speed output, the bandwidth of which is increased by cross-coupled feed-forward capacitors. This arrangement may be optionally repeated for additional gain.

An exemplary embodiment of the present invention provides a variable-gain amplifier. This amplifier includes a variable-gain voltage-to-current converter stage, which has a grounded emitter-degenerated pair coupled to an input port, as well as a transistor quad coupled to the emitter grounded emitter degenerated pair and a first supply terminal.

Another exemplary embodiment of the present invention provides a variable-gain amplifier. The amplifier includes a variable-gain voltage-to-current converter stage that has a grounded emitter-degenerated pair coupled to an input port and is configured to convert an input signal at the input port to a first differential current, as well as a transistor quad coupled to the emitter grounded emitter degenerated pair, a first supply terminal, and a shunt feedback stage. The transistor quad is configured to steer the first differential current between the first supply terminal and the shunt feedback stage.

A further exemplary embodiment of the present invention provides a variable-gain amplifier. The amplifier includes a variable-gain voltage-to-current converter stage. The converter stage includes a first input terminal, a second input terminal, a first resistor coupled to the first input terminal, a second resistor coupled to the second input terminal, a first transistor coupled between the first resistor and a first node, a second transistor coupled between the second resistor and a second node, a third transistor coupled between the first node and a first output node, a fourth transistor coupled between the second node and a second output node, a fifth transistor coupled between the first node and a first supply terminal, and a sixth transistor coupled between the second node and a first supply terminal.

Yet another exemplary embodiment of the present invention provides another variable-gain amplifier. This amplifier includes an input stage having an input and an output, a variable gain stage having an input, an output, and a control voltage input, the input coupled to the output of the input stage, and a shunt feedback stage having an input and an output, the input coupled to the output of the transistor quad.

Another exemplary embodiment of the present invention provides a variable-gain amplifier. This amplifier includes a variable gain stage, a shunt feedback stage coupled to an output of the variable gain stage, and a differential emitter-follower buffer stage coupled to an output of the shunt feedback stage. The differential emitter follower buffer stage includes speed-up cross coupled capacitors.

Still another exemplary embodiment of the present invention provides a variable-gain amplifier. The amplifier includes a first input stage, a first variable gain stage coupled to an output of the first input stage, a first shunt feedback stage coupled to an output of the first variable gain stage, a first emitter-follower stage coupled to an output of the first shunt feedback stage, a second input stage coupled to an output of the first emitter-follower stage, a second variable gain stage coupled to an output of the second input stage, a second shunt feedback stage coupled to an output of the second variable gain stage, and a second emitter-follower stage coupled to an output of the second shunt feedback stage.

A better understanding of the nature and advantages of the present invention may be gained with reference to the following detailed description and the accompanying drawings.

BRIEF DESCRIPTION OF THE DRAWINGS

FIG. 3A is a schematic of a voltage-to-current converter that may be used as the voltage-to-current converter 220 in FIG. 2B, or as a voltage-to-current converter in other embodiments of the present invention;

FIG. 3B is a schematic of a voltage-to-current converter that may be used as the voltage-to-current converter 260 in FIG. 2B, as voltage-to-current converter 220 in FIG. 2B, or as a voltage-to-current converter in other embodiments of the present invention;

FIG. 3C illustrates the relationship between the output currents and the input voltage for the circuits of FIGS. 3A and 3B.

FIG. 4A is a schematic of a current-steering circuit that may be used as the current-steering circuits 230 and 270 in FIG. 2B, or as current-steering circuits in other embodiments of the present invention;

FIG. 4B illustrates the transfer characteristics of a current-steering circuit consistent with an embodiment of the present invention;

DESCRIPTION OF EXEMPLARY EMBODIMENTS

Figure 1:
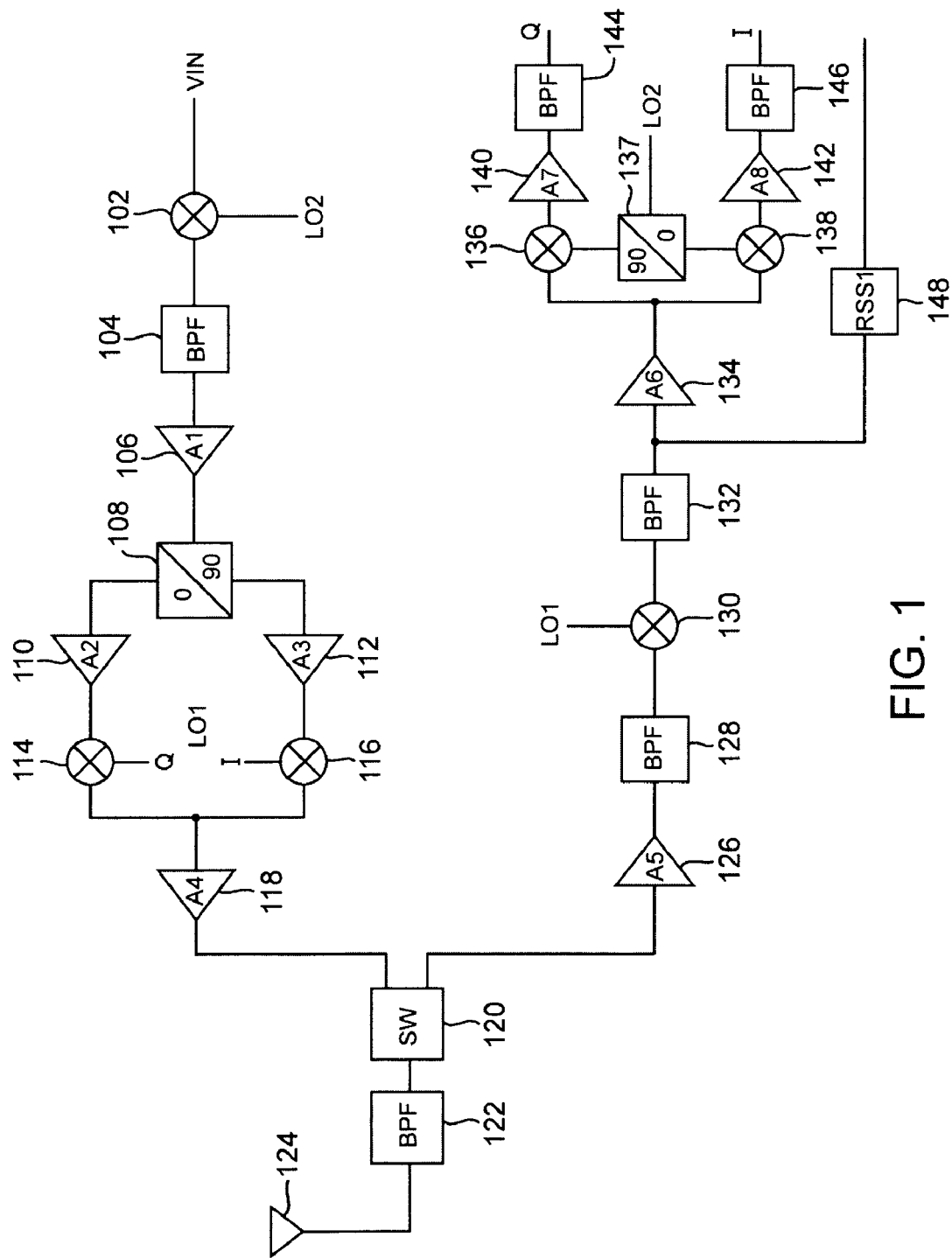
FIG. 1 is a block diagram of a portion of a transceiver that may be benefited by inclusion of embodiments of the present invention.

FIG. 1 is a block diagram of a portion of a transceiver that may be benefited by inclusion of embodiments of the present invention. Shown are a transmitter including mixer 102, bandpass filter 104, amplifier 106, phase splitter 108, amplifiers 110 and 112, I and Q mixers 114 and 116, and power amplifier 118, and a receiver including low noise amplifier (LNA) 126, bandpass filter 128, mixer 130, bandpass filter 132, amplifier 134, phase splitter 137, I and Q mixers 136 and 138, amplifiers 140 and 142, bandpass filters 144 and 146, and RSSI 148. Signals are transmitted and received on antenna 124 and filtered by bandpass filter 122. Switch 120 connects power amplifier 118 through the bandpass filter 122 to the antenna 124 in the transmitted mode, and connects the input of the low noise amplifier 126 through the bandpass filter 122 to the antenna 124 in the receive mode.

In the transmit mode, an input signal and a second local oscillator signal are multiplied by mixer 102, the output of which is filtered by bandpass filter 104. The filtered output is gained by amplifier 106, which in turn drives phase splitter 108. The phase splitter 108 provides quadrature signals, which are amplified by amplifiers 110 and 112 and multiplied by I and Q components of a first local oscillator signal using mixers 114 and 116. The I and Q components are combined and received by power amplifier 118, and coupled through switch 120 to the bandpass filter 122 and onto antenna 124 for transmission.

In the receive mode, signals are received on antenna 124, filtered by bandpass filter 122, and coupled through switch 120 to the low noise amplifier 126. The output of the low noise amplifier drives bandpass filter 128, which in turn drives mixer 130. Mixer 130 multiplies or modulates the received signal with the first local oscillator signal, and provides a down converted intermediate frequency signal to bandpass filter 132. The output of the bandpass filter 132 drives amplifier 134, which in turn drives mixers 136 and 138. A second local oscillator signal is received by phase splitter 137, which provides quadrature outputs to the mixers 136 and 138. Mixers 136 and 138 down convert the I and Q signals to baseband, where they are amplified by amplifiers 140 and 142, and filtered by bandpass filters 144 and 146. These bandpass filters provide I and Q outputs typically to analog-to-digital converters, which provide quantized outputs to a digital signal processor.

Embodiments of the present invention may benefit by this circuit by being used as one or more of the included amplifiers. Alternately, amplifiers may be provided in other locations in this circuit. For example, an amplifier may be inserted between mixer 130 and bandpass filter 132. The implemented embodiment may vary depending on where in this circuit the embodiment is used.

Figure 2A:
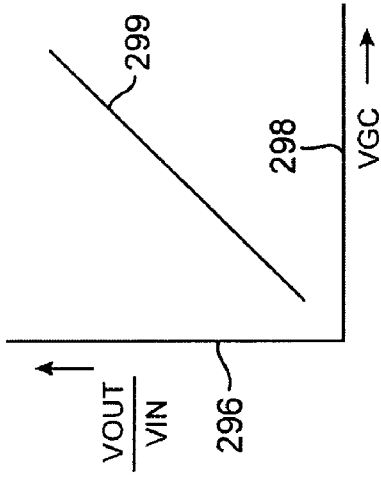
FIG. 2A is a symbolic diagram showing the input, output, and control signals for a low-voltage high-dynamic range variable-gain amplifier consistent with an embodiment of the present invention.

FIG. 2A is a symbolic diagram showing the input, output, and gain-control signals for a low-voltage high-dynamic range variable-gain amplifier consistent with an embodiment of the present invention. Included are input signal lines VINP and VINN 202, output signal lines VOUTP and VOUTN 204, and gain control lines VGCP and VGCN 206.

Figure 2C:
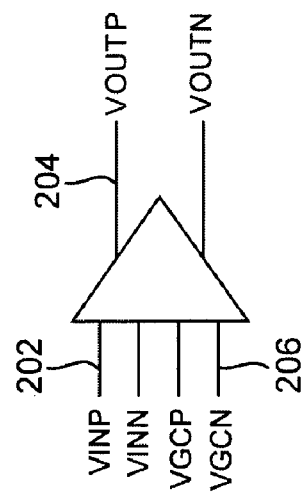
FIG. 2C illustrates the gain, or ratio of output voltage to input voltage, as a function of the gain control voltage for a low-voltage high-dynamic range variable-gain amplifier consistent with an embodiment of the present invention.
Figure 2B:
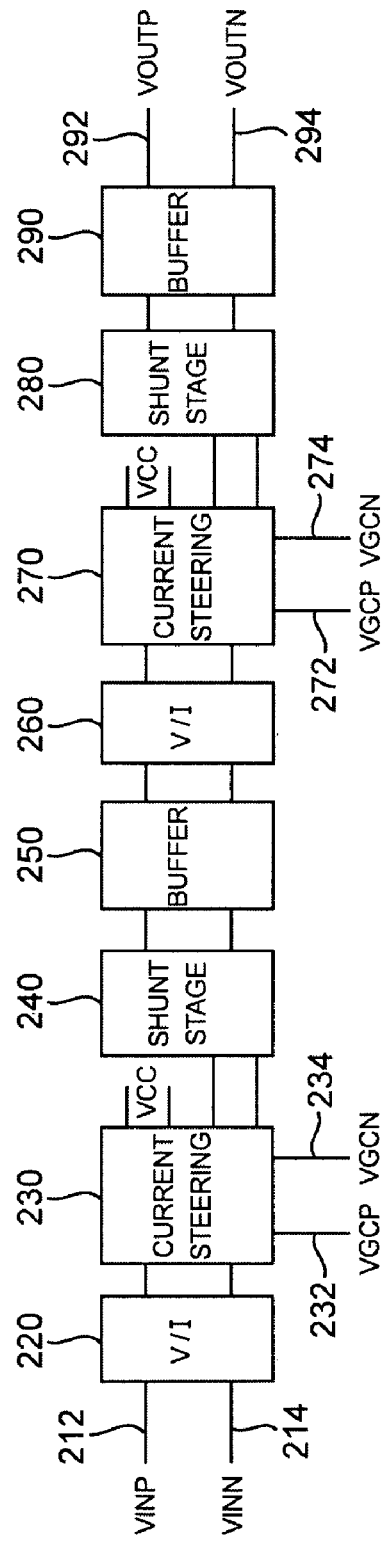
FIG. 2B is a block diagram of a low-voltage high-dynamic range variable-gain amplifier consistent with an embodiment of the present invention.

FIG. 2B is a block diagram of a low-voltage high-dynamic range variable-gain amplifier that is consistent with an embodiment of the present invention. An input signal is received on lines VINP 212 and VINN 214. This signal may be a differential signal such that each line receives a signal that is the complement of the other. Alternately, one signal may be dynamic while all the other is static. Other forms of signaling are also contemplated by embodiments of the present invention. The input voltage signal is converted to a current by voltage-to-current converter 220. This output current is steered between VCC and a shunt stage 240 by current-steering block 230. Alternately, a portion of the current is shunted to VCC, while the remainder is steered between VCC and shunt stage 240. This current steering is controlled by gain-control voltage VGCP and VGCN on lines 232 and 234. These gain-control signals may be differential in nature, alternately one signal may vary while the other is held at a fixed or DC reference level. Shunt stage 240 converts the current provided by the current steering block 230 to a voltage, which is buffered by output buffer 250.

Some embodiments of the present invention may employ only these first four stages. Alternately, some embodiments of the present invention may employ fewer than these four stages. For example, the buffer circuit 250 may not been needed in some applications.

Some embodiments of the present invention cascade these four stages with a similar four stages. Specifically the output of buffer 250 drives V/I converter 260, which converts the output voltage of the buffer 250 to a current. This current is then steered either to VCC or shunt stage 280 by current-steering stage 270. This current steering is controlled by gain control voltages VGCP and VGCN on lines 272 and 274. Lines 232 and 234 may be the same or connected to lines 272 and 274. Alternately, these lines may be separate lines controlled by separate circuits. The output of shunt stage 280 drives buffer circuit 290, which in turn provides VOUTP and VOUTN on lies 292 and 294. Due to the nature of this circuitry, the output signals VOUTP and VOUTN are typically complementary differential output signals, though other types of signaling are contemplated by embodiments of the present invention.

FIG. 2C illustrates the gain, or ratio of output voltage to input voltage, as a function of the gain control voltage VGC for a low-voltage high-dynamic range variable-gain amplifier consistent with an embodiment of the present invention. Gain is plotted along a Y-axis 296 as a function of the gain control voltage, which is plotted along the X-axis 298. The gain curve 299 may be linear, geometric, exponential, a mixture of these, or other type of function. In one embodiment of the present invention, the gain as a function of control voltage is monotonic over a wide range of gain control voltages. In another embodiment that uses a pre-distortion circuit to steer the gain control, the gain as a function of control voltage is linear over a wide range when the gain is depicted logarithmically. Specifically, the linear nature of the curve 299 in this example is achieved using a pre-distortion circuit consistent with an embodiment of the invention described in "A Low-Voltage Pre-Distortion Circuit for Linear in dB Variable-Gain Cells," by Stroet, application Ser. No. 10/637,714, filed Aug. 8, 2003.

FIG. 3A is a schematic of a voltage-to-current converter that may be used as the voltage-to-current converter 220 in FIG. 2B, or as a voltage-to-current converter in other embodiments of the present invention. This circuit may be referred to as a grounded emitter-degenerated pair. Included are input resistors R1A 302 and R1B 304, input transistors T1A 306 and T1B 308, current source 310, current source transistor T1C 312 and emitter degeneration resistor R1C 314, and beta helper circuit T6 316, T5 318, and R9 320. An input source VINP is applied, and may be modeled as a voltage source and resistor (not shown), which is typically 50 ohms. Transformer TR1 324 is also included. In an embodiment of the present invention, the transformer TR1 may be a narrow band LC circuit.

An input voltage is applied between terminals VINP 301 and VINN 302, creating a current through the primary winding of transformer TR1 324, thus generating a current in the center-tapped secondary winding. The current in the secondary winding flows through input resistors R1A 302 and R1B 304, thus generating a differential AC output current in the collectors of transistors T1A 306 and T1B 308. The windings of transformer TR1 324 may be scaled appropriately for impedance matching.

Beta helper circuit transistors T6 316 and T5 318 preserve head room in this structure. Specifically, current mirror T1C 312 is biased such that it has a collector-to-base voltage near zero volts. The bias line generated at the base of current source T1C 312 may be filtered or decoupled by capacitor C1 326. This capacitor reduces the impedance between the bases of T1A 306 and T1B 308 and ground at high frequencies.

In one embodiment, transistors T1A 306 and T1B 308 are matched devices, as are resistors R1A 302 and R1B 304. Transistors T1C 312 and R1C 314 match transistors T1A 306 and T1B 308 and resistors R1A 302 and R1B 304. Alternately, the transistor T1C 312 and resistor R1C 314 may scale transistors T1A and T1B 306 and 308, and resistors R1A 302 and R1B 304. For example, transistor T1C 312 may be one-half the size of transistors T1A 306 and T1B 308, while resistor R1C may be twice the value of resistors R1A 302 and R1B 304. If transistors T1C 312, T1A 306, and T1B 308 and resistors R1C 314, R1A 302, and R1B 304 each match, the DC component of the currents at IOUTP and IOUTN are approximately equal to the current in current source 310.

In one embodiment of the present invention, current source 310 provides a current that is approximately insensitive to temperature, such as a current generated by applying a bandgap voltage across a resistor. Such as current is largely temperature invariant-though it does still vary with temperature—but is a function of resistor tolerance, which is typically on the order of plus and minus twenty percent. In other embodiments, other types of bias current may be used, for example the current may be proportional to absolute temperature (PTAT).

It will be appreciated by one skilled in the art that other voltage-to-current conversion architectures can be used. For example, an emitter-degenerated differential pair biased with a tail current may be used. The grounded emitter-degeneration pair used has better IP3 performance—that is, better linearity and reduced introduction of the third harmonic—due to its class AB behavior as compared to the class A behavior of a differential pair.

In this example, the voltage-to-current converter shown is formed using a bipolar manufacturing process, which may be a silicon-germanium process, for example. In other embodiments, other devices formed using other processes may be used, for example the active devices may be pHEMT, complementary metal oxide semiconductor (CMOS), heterogeneous bipolar transistors (HBTs), or any other appropriate type of device. This is true for all the other included schematics.

FIG. 3B is a schematic of a voltage-to-current converter that may be used as the voltage-to-current converter 260 in FIG. 2B, as voltage-to-current converter 220 in FIG. 2B, or as a voltage-to-current converter in other embodiments of the present invention. Included are input coupling capacitors C3A 372 and C3B 374, transistors T1A 356 and T1B 358, resistors R11A 352 and R11B 354, current source 360, current source transistor T11C 362 and emitter degeneration resistor R11C 364, and beta helper circuit Ibias 380, T16 366, T15 368, and R19 370, and biasing resistors R12A 380, R12B 382, and R12C 384.

An input signal is received by input coupling capacitors C3A 372 and C3B 374 on lines VINP 348 and VINN 349. The signals modulate the voltages at the bases of devices T11A 356 and T11B 358. This change in voltage leads to changes in voltage drops across emitter-degeneration resistors R11A 352 and R11B 354. This change in voltage across the emitter degeneration resistor results in changes in the output currents at the collectors of transistors T11A 356 and T11B 358. Biasing resistors R12A 380 and R12B 382 isolate the AC components of the voltages at the bases of devices T11A 356 and T11B 358 from the DC voltage provided at the emitter of T15 368. Current from current source 360 flows through transistor T11C 362 and resistor R11C 364, thus setting the DC bias point for the bases of transistors T11A 356 and T11B 358.

FIG. 3C illustrates the relationship between the output currents and the input voltage for the circuits of FIGS. 3A and 3B. The output currents, which are equal to the voltage at the output of the transformer TR1 324 for the example in FIG. 3A and the voltage at the bases of T11A 356 and T11B 358 for the example in FIG. 3B, divided by the input resistance, are plotted along a y-axis 390 as a function of the input voltage along x-axis 392. The transfer characteristics 394 are generally linear, ignoring changes in the base emitter voltage of the input transistors as a function of current. The output currents in FIG. 3A are approximately equal to the voltage at the output of the transformer TR1 324, divided by the sum of R1A 302 and R1B 304. The input impedance of FIG. 3A is the sum of R1A and R1B divided by the impedance ratio of the transformer TR1 324. The output currents in FIG. 3B are approximately equal to the differential voltage at the bases of T11A 356 and T11B 358, divided by the sum of R11A 352 and R11B 354.

FIG. 4A is a schematic of a current-steering circuit that may be used as the current-steering circuits 230 and 270 in FIG. 2B, or as current-steering circuits in other embodiments of the present invention. Included are a first differential pair including devices T2A 410 and T2B 420, and a second differential pair including devices T2C 430 and T2D 440.

A portion of each input current is shunted away from its differential pair to VCC. The remaining input currents are steered between a load resistor or VCC. Specifically, a portion of the input current on line IINP 402 flows through resistor R2A 470 while the remainder flows through transistors T2A 410 and T2B 420 to load resistor R3A 450 and VCC 490. Similarly, a portion of the input current on line IINN 404 flows through resistor R2B 480 while the remainder flows through transistors T2C 430 and T2D 440 to load resistor R3B 460 and VCC 490.

This reduction in differential pair current caused by resistors R2A 470 and R2B 480 lowers the noise contribution of this quad circuit since some of the input current, and hence its noise contribution, is shunted to VCC. Also, the voltage gain of the quad cell is increased, while the control voltage sensitivity at the gain control input is lowered, thus improving the circuit's immunity to noise coming from the gain control circuitry.

In a specific embodiment of the present invention, the input currents, in the absence of an input signal, remain constant. Similarly, the current in resistors R2A 470 and R2B 480 are also constant. This is achieved by biasing the gain control inputs to a PTAT voltage, such that there is a PTAT voltage plus a diode drop, which is approximately the bandgap voltage, across the resistors R2A 470 and R2B 480.

It will be appreciated by one skilled in the art that other variations on this circuit are possible. For example, resistors R2A 470 and R2B 480 may be replaced by current sources, or removed entirely.

FIG. 4B illustrates the transfer characteristics of a current-steering circuit consistent with an embodiment of the present invention. The gain is plotted along a y-axis 902 as a function of the gain control voltage VGC along x-axis 904. In this particular example, the gain characteristics, that is the output voltage divided by the input current, is plotted as curve 906. In this example the transfer characteristics are for the circuit of FIG. 4A, and approximately follow a hyperbolic tangent function, though other functions may be realized by other circuits consistent with the present invention.

Figure 5:
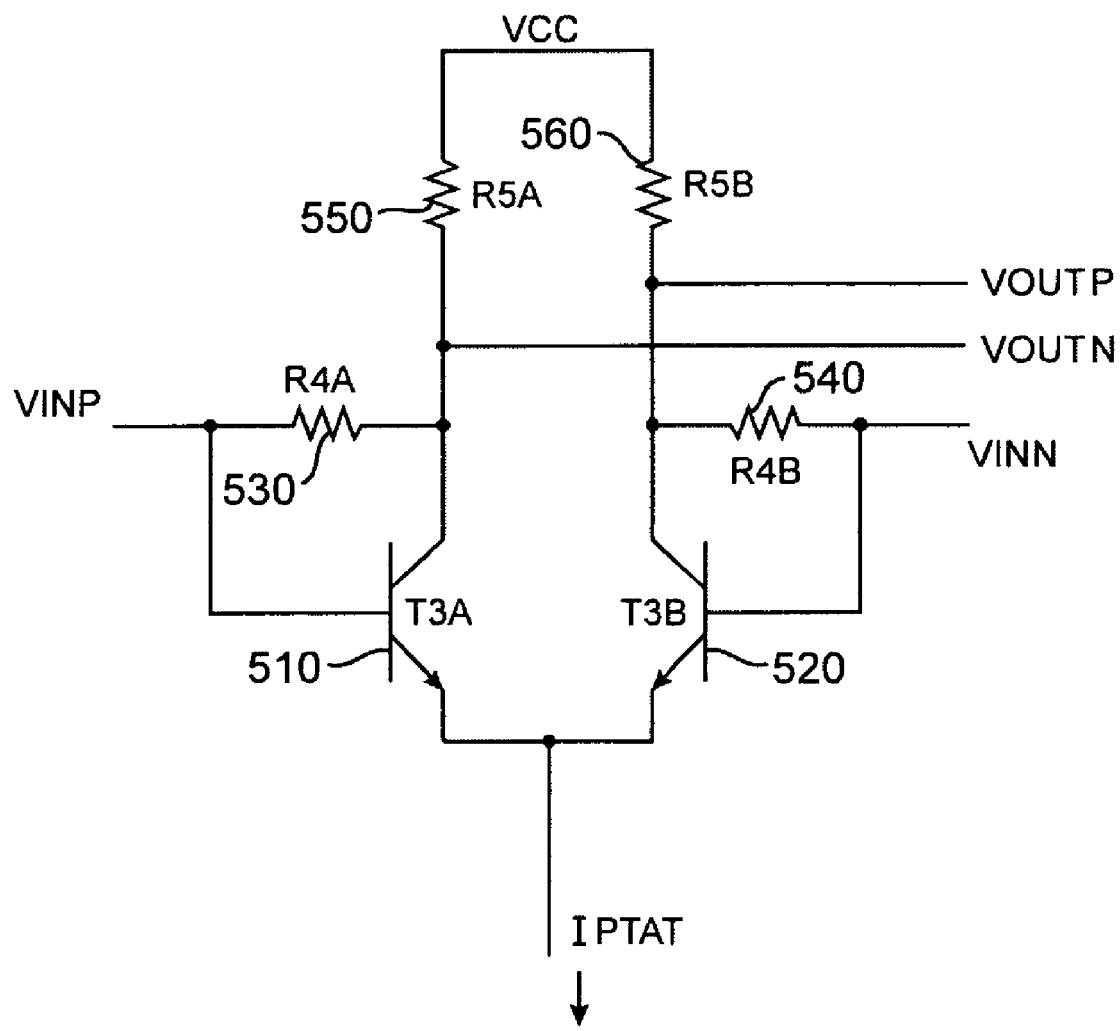
FIG. 5 is an exemplary shunt stage that may be used as the shunt stages 240 or 280 in FIG. 2B, or as other shunt stages in other embodiments of the present invention.

FIG. 5 is an exemplary shunt stage that may be used as the shunt stage 240 or 280 in FIG. 2B, or as other shunt stages in other embodiments of the present invention. This stage may be referred to as a shunt feedback stage. Included are differential pair T3A 510 and T3B 520, input resistors R4A 530 and R4B 540, and load resistors R5A 550 and R5B 560.

This stage forms a transimpedance amplifier that converts a differential input current to a differential voltage output. The transimpedance gain, that is the output voltage divided by the input current, is ideally equal to the value of resistor R4A 530 and R4B 540. However, because of a moderate loop gain in the shunt stage, the transimpedance gain can be significantly lower. This stage provides a low input impedance for the high output impedance current steering stage, and also provides a low output impedance to a following buffer output stage.

This stage, combined with the previous input voltage-to-current converter and current steering stages provide a wide bandwidth path having a maximum gain that is approximately equal to the value of the resistors R4A 530 and R4B 540 divided by the resistors R1A 302 and R1B 304 in FIG. 3A. This maximum gain is reduced by the ratio of R1A and R1A+1/gm of T1A in FIG. 3A, slightly by the presence of resistors R2A 470, R2B 480, R3A 450, and R3B 460 in FIG. 4A, and significantly because of the moderate loop gain of this shunt stage. The maximum gain is further reduced by the amount of current steering to VCC provided by the quad stage T2A 410, T2B 420, T2 C 430, and T2B 440.

This shunt feedback stage is a simple design that fits in a low 1.8 supply voltage design. Also, input resistors R4A 530 and R4B 540 are large but have little current in them, allowing for a high gain with the low supply voltage. It will be appreciated by one skilled in the art that other designs may be used, for example a multiple transistor arrangement can be used for higher gain.

Figures 6A, 6B:
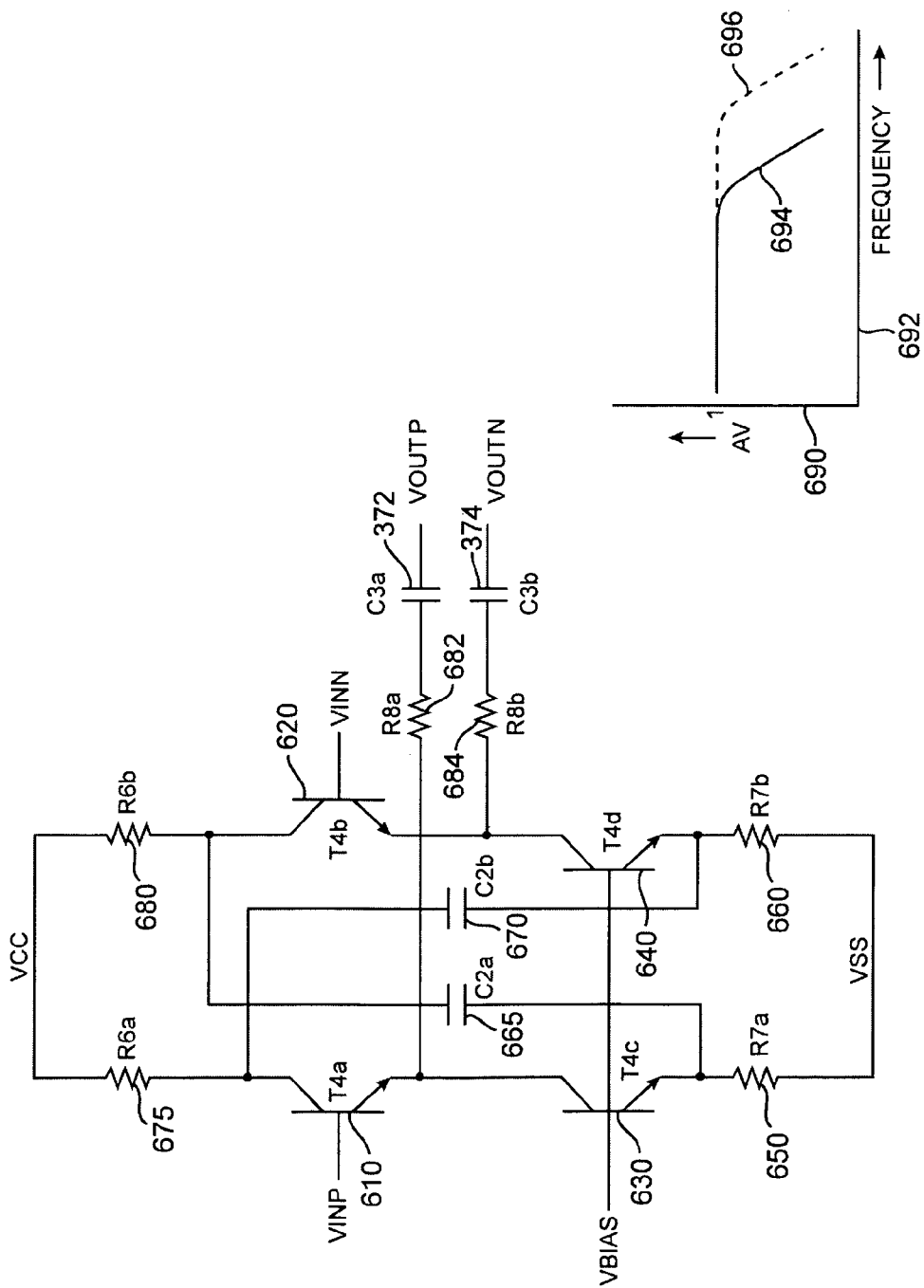
FIG. 6A is a schematic of a buffer or level shift that may be used as the buffers 250 or 290 in FIG. 2B, or as an output buffer in other embodiments of the present invention.
FIG. 6B is a plot showing the gain of the buffer of FIG. 6A as a function of frequency.

FIG. 6A is a schematic of a level shift or output buffer that may be used as the buffers 250 or 290 in FIG. 2B, or as a buffer in other embodiments of the present invention. Included are emitter followers T4A 610 and T4B 620, current source transistors T4C 630 and T4D 640, and current source emitter degeneration resistors R7A 650 and R7B 660. Also included are speed-up cross-coupled capacitors C2A 665 and C2B 670, which are driven by resistors R6A 675 and R6B 680. Damping resistors R8A 682 and R8B 684 are also included. Coupling capacitors C3A 372 and C3B 374 are repeated from FIG. 3B.

The operation of the speed-up capacitors can be illustrated as follows. When the voltage VINP at the base of T4A 610 is increased, the voltage VINN at the base of T4B 620 decreases. As the voltage at the base of T4B 620 is decreased, that device begins to turn off. Accordingly, the current in the collector of transistor T4D 640 is diverted to the output load at VOUTN., thus discharging that node. As the current in device T4B 620 is reduced, the voltage drop across resistor R6B 680 is reduced, thus increasing the voltage at the collector of device T4B 620. This increasing voltage is transferred though the capacitor C2A 665 to the emitter of T4C 630. This increasing voltage provides current to emitter degeneration resistor R7A 650, thus reducing the current in transistor T4C 630. As this current reduces, more of the current provided by the emitter of device T4A 610 is available to charge the output node VOUTP.

Similarly, the current in device T4A 610 increased, thus increasing the voltage drop across R6A 675, and decreasing the voltage at the collector of T4A 610. This reduction in voltage is transferred through capacitor C2B 670 to the emitter of T4D, thus increasing its current, and further speeding the discharge of the node VOUTN.

The inclusion of resistors R6A 675 and R6B 680 also act as a filter to isolate VCC from changes in the currents in emitter follower devices T4A 610 and T4B 620. Resistors R8A 682 and R8B 684 isolate emitter follower devices T4A 610 and T4B 620 from their capacitive loads to reduce ringing. The value of capacitors C3A 372 and C3B 374 are selected to minimize their size and their parasitic plate capacitance, which must be driven, while being large enough for noise performance reasons at lower intermediate frequency levels and gain loss due to the capacitive division that occurs when driving capacitive loads.

It will be appreciated by one skilled in the art that other circuits may be used for this function. For example, simple emitter followers may be used, though the bandwidth and driving capability of the stage would be reduced without the use of the cross-coupled speed-up capacitors.

FIG. 6B is a plot showing the gain of the buffer stage of FIG. 6A as a function of frequency. The gain of this stage, which is nominally one and limited by the capacitances of the devices in the circuit, is plotted along a y-axis 690 as a function of frequency, which is shown as x-axis 692. The bandwidth of a representative gain curve 694 is widened to the gain curve 696 by the inclusion of speed-up capacitors C2A 665 and C2B 670.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A variable-gain amplifier comprising:
   a variable-gain voltage-to-current converter stage comprising:
   a grounded emitter-degenerated pair coupled to an input port, the grounded emitter-degenerated pair having first and second devices that are coupled in a common-base configuration; and
   a transistor quad coupled between the emitter grounded emitter degenerated pair and a first supply terminal.

2. The variable-gain amplifier of claim 1 further comprising a shunt feedback stage coupled to an output of the transistor quad.

3. The variable-gain amplifier of claim 1 wherein the input port comprises a first input terminal and a second input terminal.

4. The variable-gain amplifier of claim 3 wherein the grounded emitter-degenerated pair comprises:
   a first resistor coupled to the first input terminal;
   a second resistor coupled to the second input terminal;
   a first device coupled between the transistor quad and the first resistor; and
   a second device coupled between the transistor quad and the second resistor.

5. The variable-gain amplifier of claim 4 wherein the grounded emitter-degenerated pair is biased such that a first approximately temperature insensitive current flows in the first device, and a second approximately temperature insensitive current flows in the second device.

6. The variable-gain amplifier of claim 5 wherein the first approximately temperature insensitive current is approximately equal to the second approximately temperature insensitive current.

7. The variable-gain amplifier of claim 6 wherein a portion of the first approximately temperature insensitive current and a portion of the second approximately temperature insensitive current are shunted away from the transistor quad.

8. The variable-gain amplifier of claim 7 wherein the portion of the first approximately temperature insensitive current and the portion of the second approximately temperature insensitive current are each approximately temperature insensitive.

9. The variable-gain amplifier of claim 5 wherein the transistor quad further comprises a gain-control voltage port, and the gain-control voltage port is biased at a DC voltage that is approximately proportional to absolute temperature with respect to a supply voltage.

10. A variable-gain amplifier comprising:
    a variable-gain voltage-to-current converter stage comprising:
    a grounded emitter-degenerated pair coupled to an input port and configured to convert an input signal at the input port to a first differential current;
    a device that is coupled to form a current mirror with the grounded emitter-degenerated pair; and
    a transistor quad coupled to the grounded emitter degenerated pair, a first supply terminal, and a shunt feedback stage, and configured to steer the first differential current between the first supply terminal and the shunt feedback stage.

11. A variable-gain amplifier comprising:
    a variable-gain voltage-to-current converter stage comprising:
    a grounded emitter-degenerated pair coupled to an input port and configured to convert an input signal at the input port to a first differential current;
    a transistor quad coupled to the grounded emitter degenerated pair, a first supply terminal, and a shunt feedback stage, and configured to steer the first differential current between the first supply terminal and the shunt feedback stage; and
    a current path coupled between the grounded emitter-degeneration pair and the first supply terminal, and configured to shunt a portion of the first differential current away from the transistor quad.

12. The variable-gain amplifier of claim 11 wherein the current path is a resistor.

13. The variable-gain amplifier of claim 11 wherein the current path is a current source.

14. The variable-gain amplifier of claim 11 wherein the DC component of the first differential current and the portion of the first differential current are approximately temperature insensitive.

15. A variable-gain amplifier comprising:
    a variable-gain voltage-to-current converter stage comprising:
    a first input terminal;
    a second input terminal;
    a first resistor coupled to the first input terminal;
    a second resistor coupled to the second input terminal;
    a first transistor coupled between the first resistor and a first node;
    a second transistor coupled between the second resistor and a second node, wherein the first and the second transistors are coupled together in a common-base configuration;
    a third transistor coupled between the first node and a first output node;
    a fourth transistor coupled between the second node and a second output node;
    a fifth transistor coupled between the first node and a first supply terminal; and
    a sixth transistor coupled between the second node and a first supply terminal.

16. The variable-gain amplifier of claim 15 wherein the variable-gain voltage-to-current converter stage further comprises:
    a third resistor coupled between the first node and the first supply node; and
    a fourth resistor coupled between the second node and the first supply node.

17. The variable-gain amplifier of claim 15 wherein the first transistor and the second transistor are bipolar devices.

18. The variable-gain amplifier of claim 15 wherein a control node of the third transistor is coupled to a control node of the fourth transistor and a first gain control voltage terminal, and a control node of the fifth transistor is coupled to a control node of the sixth transistor and a second gain control voltage terminal.

19. The variable-gain amplifier of claim 18 wherein the variable-gain voltage-to-current converter stage further comprises:
   a third resistor coupled between the first node and the first supply node; and
   a fourth resistor coupled between the second node and the first supply node, and
   wherein the first gain control voltage terminal and the second gain control voltage terminal are biased such that the currents in the third resistor and the fourth resistor are approximately temperature insensitive.

20. A variable-gain amplifier comprising:
   an input stage having an input and an output, wherein the input stage includes a grounded emitter-degenerated pair having first and second transistors coupled in a common-base configuration;
   a variable gain stage having an input, an output, a transistor quad, and a control voltage input, the input coupled to the output of the input stage; and
   a shunt feedback stage having an input and an output, the input coupled to the output of the transistor quad.

21. The variable-gain amplifier of claim 20 wherein the grounded emitter-degenerated pair includes a third transistor coupled to inputs of the grounded emitter-degenerated pair.

22. A variable-gain amplifier comprising:
   an input stage having an input and an output, wherein the input stage is a grounded emitter-degenerated pair;
   a variable gain stage having an input, an output, a control voltage input, and a transistor quad, the input coupled to the output of the input stage;
   a shunt feedback stage having an input and an output, the input coupled to the output of the transistor quad, wherein the shunt feedback stage comprises:
   a first device coupled between a current source and a first output terminal;
   a second device coupled between the current source and a second output terminal;
   a first resistor coupled between a control terminal of the first device and the first output terminal;
   a second resistor coupled between a control terminal of the second device and the second output terminal;
   a third resistor coupled between the first output terminal and a first supply terminal; and
   a fourth resistor coupled between the second output terminal and the first supply terminal,
   wherein the first output terminal and the second output terminal form the output of the shunt feedback stage.

23. A variable-gain amplifier comprising:
   a variable gain stage comprising a first differential pair, a second differential pair, a first current path coupled in parallel with the first differential pair, and a second current path coupled in parallel with the second differential pair;
   a shunt feedback stage coupled to an output of the variable gain stage; and
   a differential emitter-follower buffer stage coupled to an output of the shunt feedback stage,
   wherein the differential emitter follower buffer stage comprises speed-up cross coupled capacitors.

24. The variable-gain amplifier of claim 23 wherein the differential emitter-follower buffer stage further comprises:
   a first device coupled between a first resistor and a first current source;
   a second device coupled between a second resistor and a second current source,
   wherein the speed-up cross coupled capacitors comprise:
   a first capacitor coupled between the first resistor and the second current source; and
   a second capacitor coupled between the second resistor and the first current source.

25. The variable-gain amplifier of claim 24 further comprising an input stage coupled to an input of the variable gain stage.

26. A variable-gain amplifier comprising:
   a variable gain stage;
   a shunt feedback stage coupled to an output of the variable gain stage; and
   a differential emitter-follower buffer stage coupled to an output of the shunt feedback stage, wherein the differential emitter follower buffer stage comprises speed-up cross coupled capacitors that comprise a first capacitor coupled between the first resistor and the second current source and a second capacitor coupled between the second resistor and the first current source, a first device coupled between a first resistor and a first current source, and a second device coupled between a second resistor and a second current source;
   wherein the shunt feedback stage comprises:
   a third device coupled between a current source and a first output terminal;
   a fourth device coupled between the current source and a second output terminal;
   a third resistor coupled between a control terminal of the third device and the first output terminal;
   a fourth resistor coupled between a control terminal of the fourth device and the second output terminal;
   a fifth resistor coupled between the first output terminal and a first supply terminal; and
   a sixth resistor coupled between the second output terminal and the first supply terminal,
   wherein the first output terminal is coupled to a control electrode of the first device and the second output terminal is coupled to a control electrode of the second device.

* * * * *